United States Patent [19]

Wehner

[11] Patent Number: 4,603,331
[45] Date of Patent: Jul. 29, 1986

[54] RADAR TARGET SPECTRUM CLASSIFIER

[75] Inventor: Donald R. Wehner, San Diego, Calif.

[73] Assignee: The United States of America as represented by the Secretary of the Navy, Washington, D.C.

[21] Appl. No.: 779,307

[22] Filed: Nov. 19, 1968

[51] Int. Cl.[4] .............................. G01R 23/16
[52] U.S. Cl. .................. 343/5 SA; 324/77 B
[58] Field of Search ............. 343/5 DP, 5, 8, 17.1, 343/5 SA; 324/77 B; 333/73 S

[56] References Cited

U.S. PATENT DOCUMENTS

| | | | |
|---|---|---|---|
| 2,602,836 | 7/1952 | Foster et al. | 324/77 B |
| 2,922,123 | 1/1960 | Cohn | 333/73 S X |
| 3,119,999 | 1/1964 | Jaffe | 343/17.1 |
| 3,140,486 | 7/1964 | Gillmer | 343/8 |
| 3,404,399 | 10/1968 | Eschner, Jr. | 343/8 X |
| 3,480,884 | 11/1969 | Metcalf | 333/73 S |
| 3,898,658 | 8/1975 | Jensen et al. | 343/5 SA X |
| 3,924,182 | 12/1975 | Jensen | 343/5 SA X |
| 3,984,802 | 10/1976 | Lippel, Jr. et al. | 343/5 SA X |
| 4,053,891 | 10/1977 | Opitz | 343/5 SA |
| 4,106,014 | 8/1978 | Dunn | 343/5 SA |

*Primary Examiner*—Nelson Moskowitz
*Assistant Examiner*—John B. Sotomayor
*Attorney, Agent, or Firm*—Joseph C. Warfield; George J. Rubens

[57] ABSTRACT

A radar transmitter illuminates an unidentified remote radar target with stepped or swept frequency pulses of microwave energy. The broad band of the frequencies of the reflected signal is received and divided into a large number of adjacent narrow-band segments. The amplitude of each segment is detected. The uniqueness of the set of amplitudes effectively "finger-prints" the target.

1 Claim, 6 Drawing Figures

RADAR TARGET SPECTRUM CLASSIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

A solution to the problem of identifying remote objects by radar has long been sought. The technique still being pursued with little success is that of the target-time response wherein different reflecting parts of the object at different radial distances from the transmitter are measured just as in the radar range measuring technique. Where an object may have a maximum dimension in any direction of one or two hundred feet, it can be seen that electromagnetic energy traveling at the speed of light would require extremely short pulses to obtain the necessary resolution to "see" the shape of objects of such small size. Since the speed of light is of the order of 1,000 feet per microsecond, to resolve objects 100 feet apart would require pulses of less than a few nanoseconds duration. A radar receiver, known in the prior art, intended for identifying radar targets is shown in FIG. 1 where the received nanosecond pulses of microwave energy are reduced in frequency by a local oscillator 12 in a mixer 10, are amplified at 14, detected at 16, and then processed in an extremely high bit-rate logic circuit 18.

For the system of FIG. 1 to successfully operate, the radar pulses must be extremely short in duration or pulse compression must be used, both requiring large time-bandwidth and very low phase and amplitude distortion. Such equipment is difficult to manufacture and operate. The logic circuit for processing the received pulses must have a very high clock rate or use sampling techniques to produce a reliable signature. The system of FIG. 1 poses serious operational problems also. The target of interest must be acquired, then tracked in range accurately in time within the radar's range resolution capability. No method of avoiding a human operator in the "tracking loop" exists. Rapid identification of targets using just a few radar hits from each target is not feasible because of the acquisition and tracking problem.

SUMMARY OF THE INVENTION

The objects and inventive features of this invention are obtained by a radar transmitter for generating and radiating pulses of realistic widths or durations. That is, this invention also uses wide time-bandwidth signals but identification is made on the basis of spectrum signature of targets rather than time signature. While the bandwidth of the signals is as wide as in prior art, it is accomplished with longer pulses. The wider signals are easily amplified because large phase and amplitude distortion in the transmitter and receiver can exist without causing detrimental effects on the identification process. Without detecting the signal as in prior art devices, the amplified radio frequency pulses are applied directly to a special "spectrum filter". The transmission line 25 of the filter is coupled to a series of tuned loops for selecting and passing adjacent segments or narrow bands of frequencies within the spectrum of the transmitted and reflected pulse. Each narrow band is applied to a separate circuit, and then to a separate detector. The resulting set of video pulse amplitudes obtained from a single pulse is unique and is employed to identify the target.

OBJECTS OF THE INVENTION

The object of this invention is to provide improved means for identifying and/or classifying radar targets. A more specific object of this invention is to provide improved target classification by measuring the wide band spectrum of the backscatter from remote radar targets. This is accomplished by identifying the amplitude of discrete frequencies within the spectrum reflected from the target.

A still more specific object of this invention is to provide an improved target classifier in which the high bit-rate logic circuits of the prior art are obviated.

DESCRIPTION OF THE PREFERRED EMBODIMENTS

Figure 1:
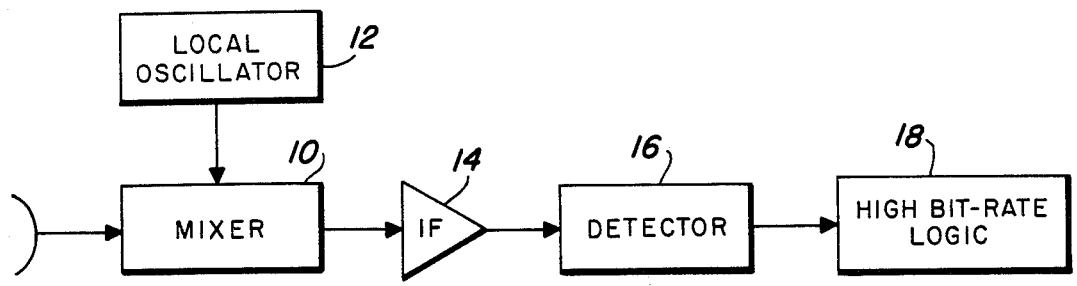
FIG. 1 is a schematic block diagram of a prior art radar receiver.
Figure 3:
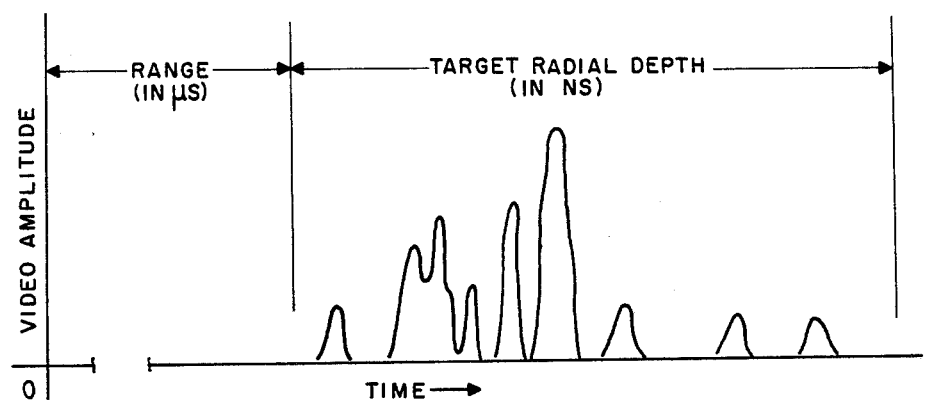
FIG. 3 is a time-amplitude graph of the signals obtained in the prior art receiver of FIG. 1.

The essential elements of the radar receiver of FIG. 1 are those of a conventional range-measuring system where the received signal is beat down in the mixer 10 by the local oscillator 12 and the reduced frequency amplified in amplifier 14 is detected in detector 16 and is processed in the logic circuits 18. A typical signal shown at the output of the detector is shown in FIG. 3 where, after the range delay measured in microseconds has elapsed, the target radial depth measured in nanoseconds in indicated by an irregular waveform such as that shown in FIG. 3 created by the backscatter from the different parts of the target. The range-time equivalence for radar is about one foot per two nanoseconds (one nanosecond equals one thousandth of one millionth of a second). The waveform of FIG. 3 which defines the target in radial depth must, therefore, be processed in very narrow pulses or time segments. This requires logic circuits at 18 having extremely high clock frequencies.

Figure 2:
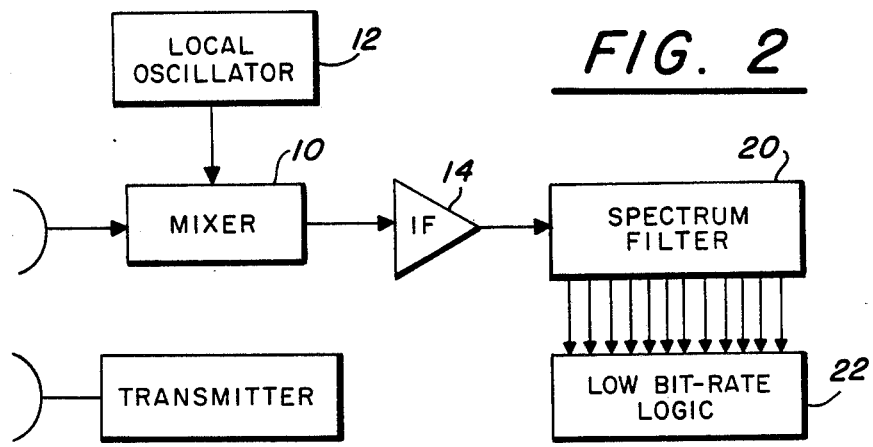
FIG. 2 is a schematic block diagram of the radar receiver of this invention.

The essential elements of the receiver of this invention shown in FIG. 2 include the mixer 10, local oscillator 12, and I-F amplifier 14. Instead of the usual detector at the output of the amplifier, the I-F feeds directly into the spectrum filter 20. The filter contemplated here serves to divide the relatively broad spectrum of the received pulse into many adjacent narrow bands. The amplitude of each narrow band signal is determined by detection and is fed into the logic circuit 22 which can have a clock rate or bit-rate equal to the radar pulse repetition frequency which is quite low compared to the logic circuit 18 of the prior art.

Figure 4:
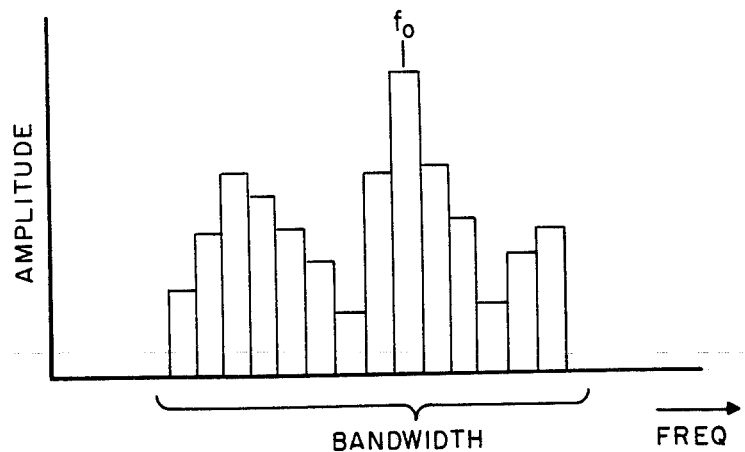
FIG. 4 is a frequency-amplitude graph of the output of the spectrum filter of this invention.

For any given radar pulse transmitted to a distant target, the amplitudes of the plurality of detected narrow band segments, shown in FIG. 4, will identify the target for any particular aspect angle. The primary advantage of the spectrum classifier is that the target classification can be achieved on the basis of geometric shapes without resorting to the extremely high resolution circuitry and logic. A second advantage over high resolution time response classification is the easing of inherent problems associated with range-gating with the possible elimination of the requirement for range-gating altogether.

Figure 5:
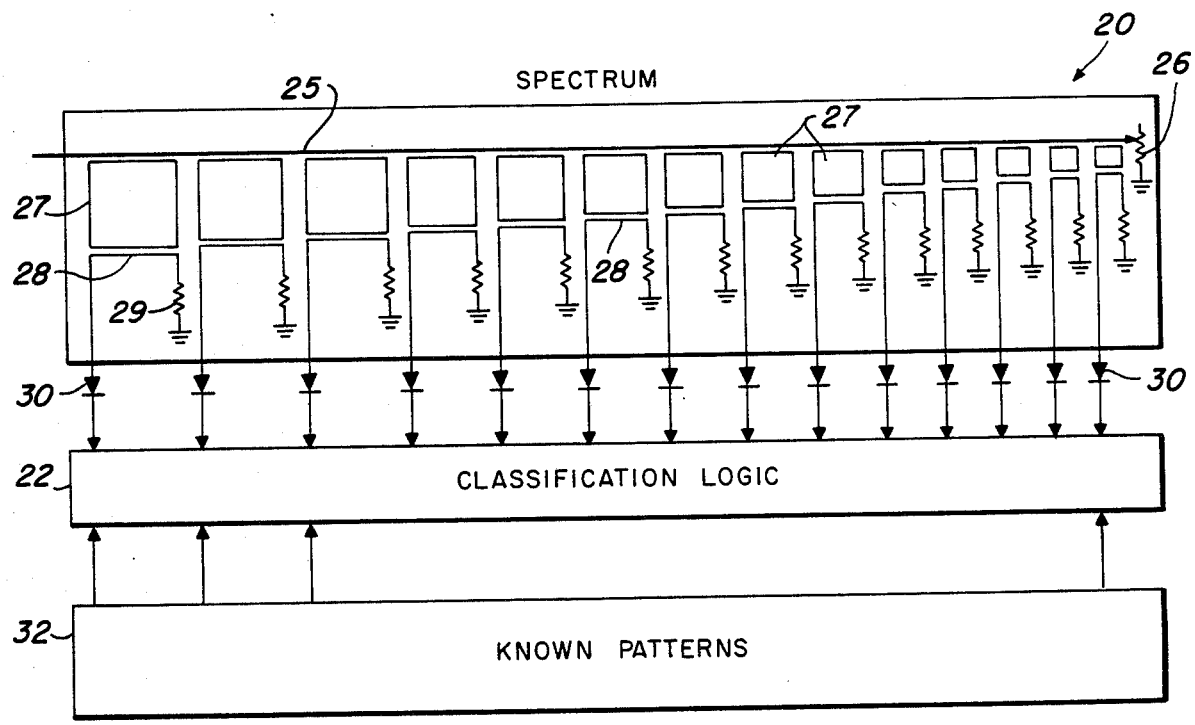
FIG. 5 is a schematic circuit diagram of the transmission line spectrum filter of the system of FIG. 2.

FIG. 5 shows the preferred spectrum filter for segmenting the spectrum of the return signal. The high frequency signal is applied to the left end of the transmission line 25 which is terminated at the right end by resistance 26 equal to the characteristic impedance of the line at the operating frequency to prevent reflection from the end of the line. A number of transmission line loops 27 of conductive ribbon or wire are distributed along the length of the line 25; one edge of each loop being insulated from, but closely coupled to, the line.

The loops are of progressively different dimensions so that they are resonant to progressively different frequencies. The output circuit for each filter section comprises, in FIG. 5, a half-turn of transmission line 28, one end of the half-loop being grounded through a terminating resistor 29, and the other end being brought out to the exterior of the casing of the assembly 20 where each output circuit is coupled through a diode detector 30. At the instant of receipt of a reflected broad band pulse from a target, the series of video pulses, FIG. 4, appear at the output terminals of the diodes 30. Desirably, the set of amplitudes can be compared in logic circuits 22 to a set of numbers corresponding to known target patterns stored in the storage logic 32 of FIG. 5. A library of standard sets of numbers of known targets stored in 32 can be rapidly fed into the classification logic circuit 22 until approximate coincidence of values occur.

Figure 6:
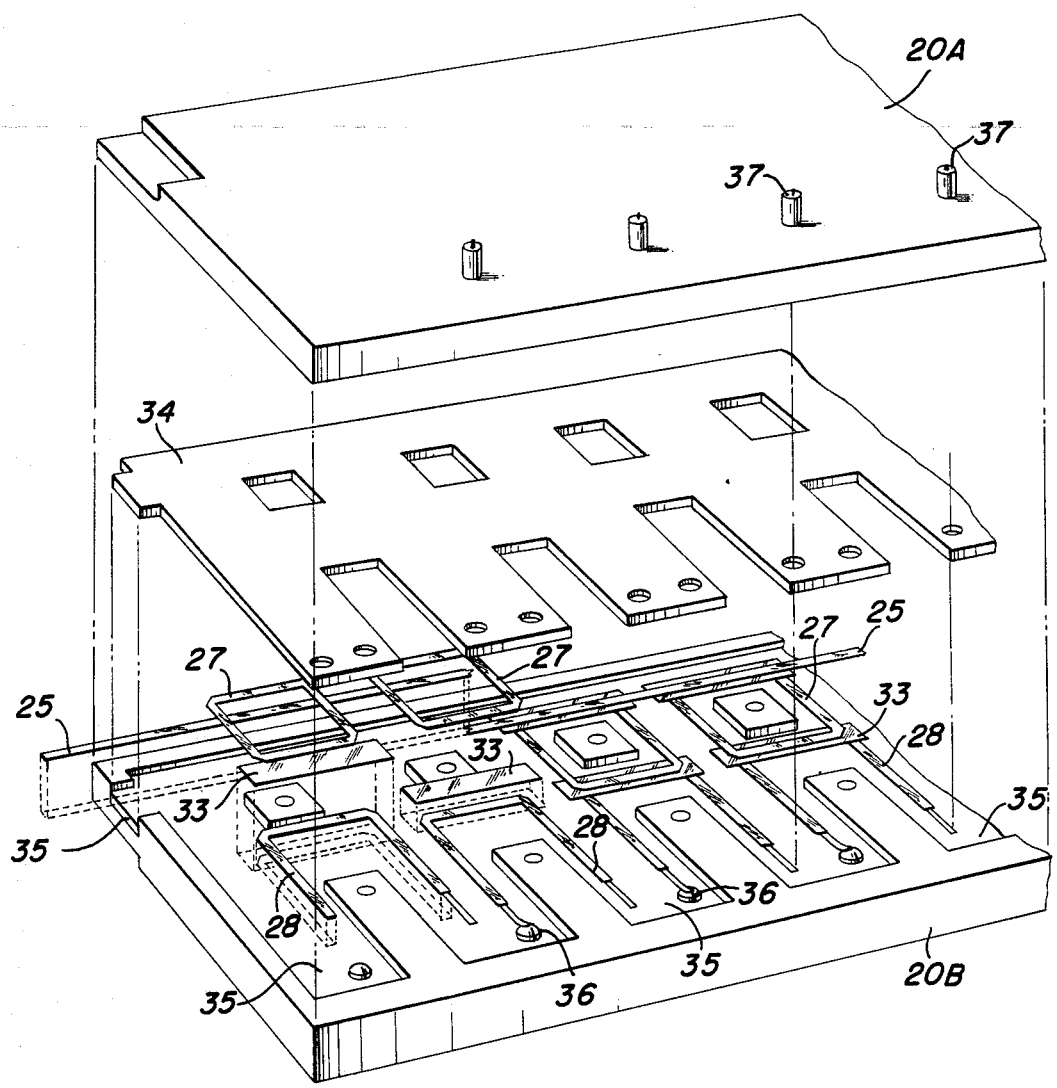
FIG. 6 is a partly exploded sectioned view of a portion of an actual transmission line of the spectrum filter of this invention.

The spectrum filter of FIG. 5 can be constructed of so-called strip-line components, if desired, although waveguides or coaxial lines may be employed for trapping successive segments of the incoming spectrum. In the interest of reasonably high "Q's" in the filter sections, the sections are formed, as shown in FIG. 6, of ribbon of high conductivity such as gold or silver and are sandwiched between sheets 34 and 35 of low-loss insulation and, hence, between the two ground plates 20a and 20b comprising halves of housing 20. The transmission line 25, also of ribbon of high conductivity, is laid over or under the adjacent edges of the rectangular loops 27 and is separated therefrom by very thin sheets or tabs 33 of low-loss insulation. Likewise, the output half-loops 28 are of ribbon overlay and are insulated from the loops 27 by thin insulating tabs. The entire assembly of conductors is clamped between sheets 34 and 35 which are in turn fitted between upper and lower metal plates 20a and 20b. One end of each loop 28 is connected to the ground plane through a carbon button resistor 36 set into registering holes in sheets 34 and 35 to suitably terminate the output circuits. The other end of the half-loop contacts wires extending through bushings 37 in one ground plate.

What is claimed is:

1. The method of identifying remote objects comprising the steps of:

illuminating the object to be identified with pulses of microwave energy of predetermined bandwidth;

receiving reflected pulse energy from said object throughout a band of frequencies within said predetermined band;

simultaneously subdividing the received band into a plurality of adjacent frequency segments and feeding said segments, respectively, to different circuits;

simultaneously detecting the amplitude of each segment;

identifying said object by the unique set of amplitude values occurring at the instant in time of the mentioned simultaneous detection; and comparing the received unique set of amplitude values with locally stored sets of amplitude values of known targets.

* * * * *